United States Patent
Nguyen et al.

(10) Patent No.: US 6,533,531 B1
(45) Date of Patent: Mar. 18, 2003

(54) DEVICE FOR HANDLING WAFERS IN MICROELECTRONIC MANUFACTURING

(75) Inventors: Binh Quoc Nguyen, Cupertino, CA (US); Alton Phillips, Mountain View, CA (US)

(73) Assignee: ASML US, Inc., San Jose, CA (US)

( * ) Notice: Subject to any disclaimer, the term of this patent is extended or adjusted under 35 U.S.C. 154(b) by 0 days.

(21) Appl. No.: 09/222,622

(22) Filed: Dec. 29, 1998

(51) Int. Cl.[7] .............................................. B65G 49/07
(52) U.S. Cl. .............................. 414/751.1; 414/225.01; 414/416.03; 414/935; 414/937; 414/941
(58) Field of Search ........................ 414/749.1, 749.2, 414/749.3, 749.4, 749.5, 751.1, 752.1, 800, 935, 937, 939, 941, 416.01, 416.03, 217, 222.01, 222.02, 225.01, 744.1, 744.2, 744.3

(56) References Cited

U.S. PATENT DOCUMENTS

| | | | |
|---|---|---|---|
| 4,714,400 A | * 12/1987 | Barnett et al. ............ | 414/751.1 |
| 4,985,722 A | 1/1991 | Ushijima et al. | |
| 5,061,144 A | 10/1991 | Akimoto et al. | |
| 5,177,514 A | 1/1993 | Ushijima et al. | |
| 5,202,716 A | 4/1993 | Tateyama et al. | |
| 5,297,910 A | 3/1994 | Yoshioka et al. | |
| 5,339,128 A | 8/1994 | Tateyama et al. | |
| 5,364,222 A | 11/1994 | Akimoto et al. | |
| 5,418,382 A | 5/1995 | Blackwood et al. | |
| 5,430,271 A | 7/1995 | Orgami et al. | |
| 5,442,416 A | 8/1995 | Tateyama et al. | |
| 5,466,945 A | 11/1995 | Brickell et al. | |
| 5,565,034 A | * 10/1996 | Nanbu et al. ............ | 414/935 X |
| 5,571,325 A | * 11/1996 | Ueyama et al. ......... | 414/935 X |
| 5,575,376 A | * 11/1996 | Colamussi ............... | 414/752.1 |
| 5,602,431 A | 2/1997 | Satomi et al. | |
| 5,626,675 A | * 5/1997 | Sakamoto et al. ....... | 414/935 X |
| 5,639,301 A | * 6/1997 | Sasada et al. ........... | 414/935 X |
| 5,664,254 A | 9/1997 | Ohdura et al. | |
| 5,762,745 A | * 6/1998 | Hirose ..................... | 414/217 X |
| 5,796,486 A | 8/1998 | Jacob | |
| 5,825,470 A | 10/1998 | Miyai et al. | |
| 5,937,223 A | * 8/1999 | Akimoto et al. .... | 414/225.01 X |
| 6,126,703 A | * 10/2000 | Akimoto et al. ........ | 414/935 X |
| 6,139,245 A | * 10/2000 | Hofmeister ............ | 414/416.03 |
| 6,146,083 A | * 11/2000 | Iwasaki ................... | 414/744.3 |
| 6,168,667 B1 | * 1/2001 | Yoshioka ................ | 414/935 X |

* cited by examiner

Primary Examiner—Robert P. Olszewski
Assistant Examiner—Gerald J. O'Connor
(74) Attorney, Agent, or Firm—U.P. Peter Eng; Wilson Sonsini Goodrich & Rosati

(57) ABSTRACT

A wafer handling device includes a platform having a plurality of movable grippers. A driver is mounted on the platform and selectively couples to at least one of the plurality of grippers to selectively move at least one of the plurality of grippers with regard to the platform. The driver may be magnetically coupled to at least one gripper to move it between a first proximal position and a first distal position. The driver may be mounted on the platform with a track assembly that effectuates a linear magnetic propulsion field to move the driver between the first axial position and the second axial position.

14 Claims, 6 Drawing Sheets

DEVICE FOR HANDLING WAFERS IN MICROELECTRONIC MANUFACTURING

BACKGROUND OF THE INVENTION

1. Field of the Invention

The invention relates generally to the field of microelectronic fabrication. More particularly, the invention relates to a device for handling semiconductor wafers during microelectronic fabrication.

2. Discussion of the Related Art

Prior art wafer handling devices, sometimes called wafer fabrication robots, are known to those skilled in the art. Wafer handling devices allow semiconductor wafers to be moved between fabrication stages and/or storage spaces in a substantially clean and pure environment to avoid contamination to the micro-circuit elements of the wafer. For example, fabricating wafers requires moving the wafer through a series of environmental or manufacturing chambers, such as etching chambers, ovens, and stepper chambers. In addition, wafers are also frequently required to be moved between and retained in storage cassettes by wafer handling devices during fabrication and subsequent storage.

Conventional wafer handling devices generally includes a mechanical arm having grippers that are each able to displace or place a wafer between manufacturing chambers and/or storage cassettes. The wafer handling devices often include rotational abilities, as well as abilities to adjust vertically and laterally to move wafers into various alignments and/or destinations. Due to the increased demand for wafers, wafer handling devices are increasingly required to accomplish wafer transportation in a faster and more cost-efficient manner. One approach employed by the known art includes simply increasing the operational speed of the wafer handling devices. However, the advantages that are attainable with faster wafer handling devices of the known art are often muted by the distance or duration between the origin and destination sites of the wafer. Therefore, what is required is a solution that also reduces the number of trips the wafer handling device must execute between any origin site and destination site.

Another problem with this technology has been that the complexity of the wafer handling devices has contributed to the operational costs for fabricating wafers. In particular, wafer handling devices are operated for long durations spanning hours, days or more, so that the presence of additional components and complexity subjects the device to fatigue and over-all wear and tear. Components such as frictional and electrical contacts formed on the wafer handling device are prone to compliance and fatigue problems which in turn shorten or interrupt the operation time for the wafer handling device. Therefore, what is also required is a wafer handling device that minimizes components, and more specifically, components subject to fatigue and failure such as coupling components and electrical connections associated with positioning the grippers.

One unsatisfactory approach in an attempt to solve the above-discussed problems involves using two or more individually driven grippers to handle and transport wafers between origin and destination sites. While this approach increases the speed at which the wafers are transported, a disadvantage of this solution is that the use of additional drivers increases the complexity of the machinery and the number of components, which in turn adds to the operational costs for manufacturing wafers and increasing the probability of down-time resulting from malfunction of added drivers. Therefore, what is required is a solution that minimizes the number of drivers used to transport two or more grippers between fabrication stages.

SUMMARY OF THE INVENTION

A primary object of the invention is to provide a simple and cost-efficient wafer handling device. Another primary object of the invention is to provide a wafer handling device capable of selectively actuating two or more grippers using one driver. Still another primary object of the invention is to provide a driver for moving grippers having a minimal number of components that are subject to failure and fatigue. Still another primary object of the invention is to provide a wafer handling device that uses magnetic coupling to position grippers for handling wafers. And another primary object of the invention is to provide a wafer handling device that uses magnetic propulsion to move grippers into and out of position for handling wafers.

Accordingly, the invention provides a wafer handling device that includes a platform having a plurality of grippers selectively moveably coupled thereto. A driver (aka carriage) is connected to the platform and controllably selectively couples to at least one of the plurality of grippers to selectively move at least one of the plurality of grippers with regard to the platform.

The invention also provides a wafer handling device that includes a first gripper that is slideably coupled to a platform so as to be moveable between a first proximal position and a first distal position. A driver (aka carriage) is movably connected to the platform and is adapted to form a first magnetic couple with the first gripper and thereby move the first gripper between the first proximal position and the first distal position.

The invention also provides a wafer handling device that includes a track assembly mounted on a platform. A carriage is slideably coupled to the track assembly. The track assembly effectuates a linear magnetic propulsion field to move the carriage between a first axial position and a second axial position. A gripper is moveably coupled to the platform and is controllably selectively coupled to the carriage to be moved from the first axial position to the second axial position.

These and other goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters (if they occur in more than one view) designate the same parts. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

The context of the invention includes handling semiconductor wafers during fabrication of semiconductor chips. In a specific embodiment of the invention, a wafer handling device is provided which directs one or more grippers that handle wafers. As will be made clearer below, this invention provides a wafer handling device that is simpler, less expensive, more efficient, and faster in comparison to previous devices used in the semiconductor industry.

Figure 1:
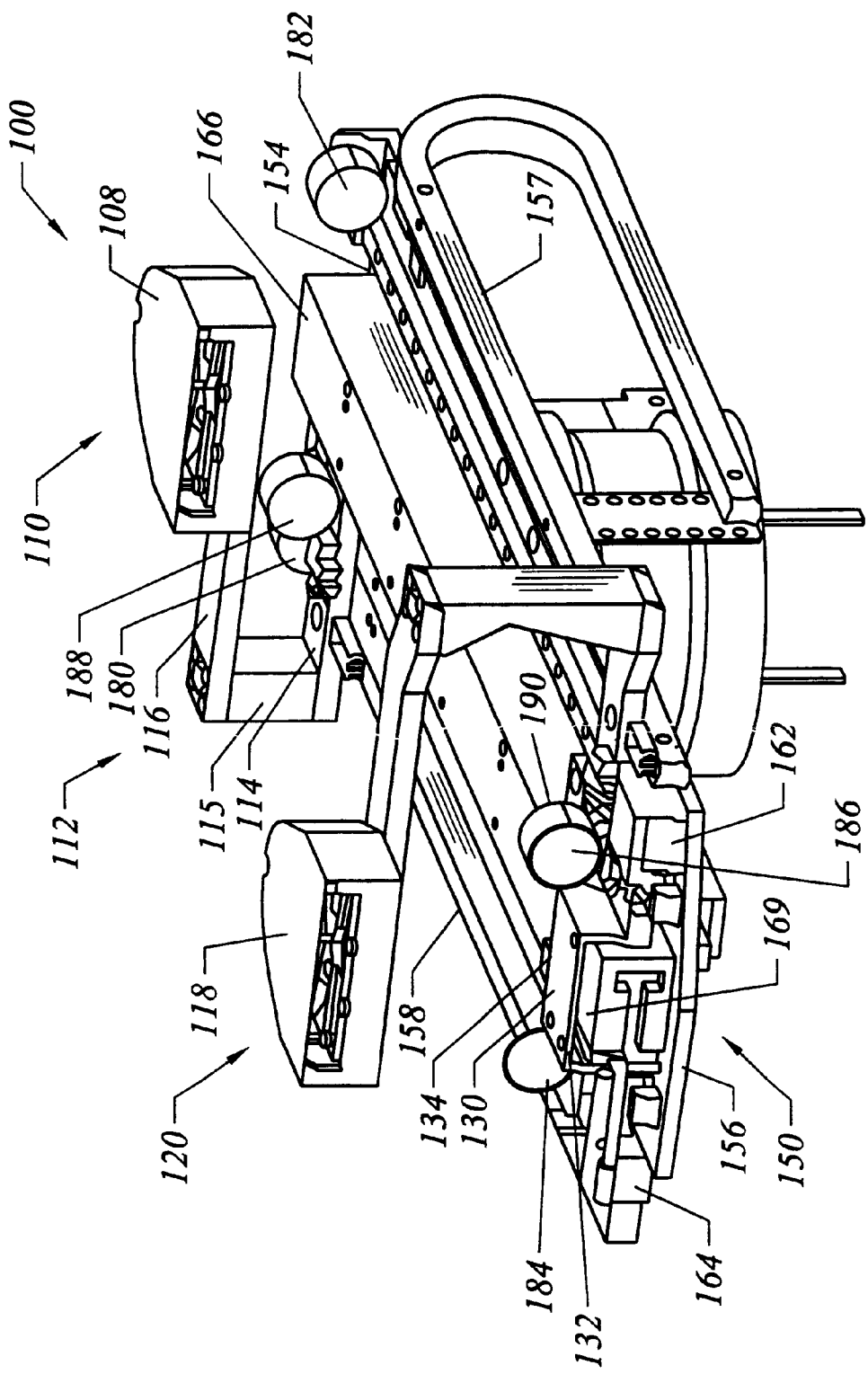
FIG. 1 is an isometric frontal view of a robot for handling semiconductor wafers, representing an embodiment of the invention.
Figure 5:
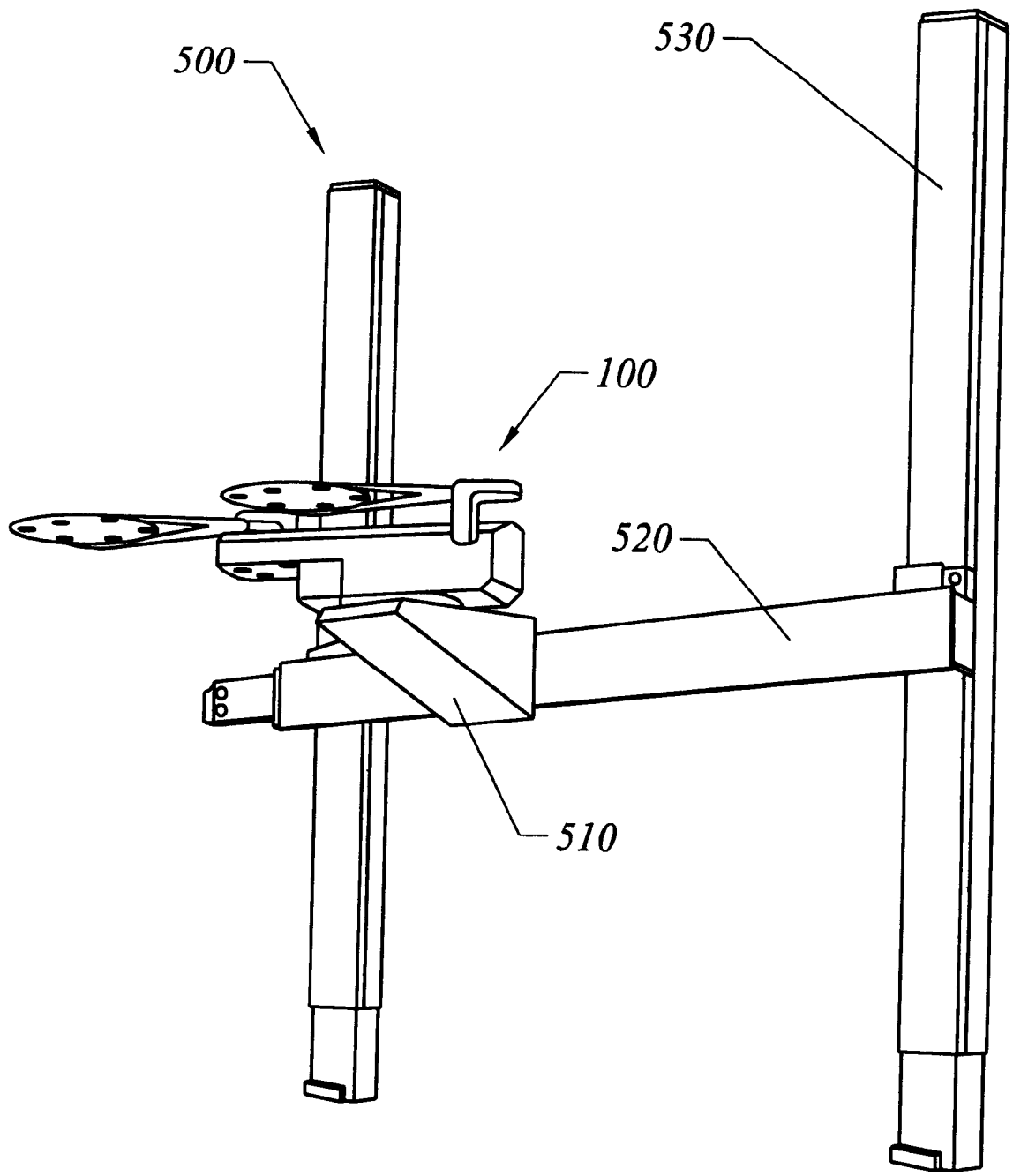
FIG. 5 is an isometric view of a framework for positioning a robot, representing an embodiment of the invention.

Referring to FIG. 1, an embodiment of this invention is shown to include a wafer handling device 100 comprising an assembly of components that cooperate to handle semiconductor wafers during fabrication. In handling wafers, the device of this invention engages, contacts, displaces, and/or otherwise transports the wafer between locations. The term coupled, as used herein, is defined as connected, although not necessarily directly, and not necessarily mechanically. The device 100 is preferably an extension of a dynamic framework (as shown by FIG. 5) for moving semiconductor wafers during the fabrication process. The framework uses the device 100 of the invention to move a semiconductor wafer between tooling or manufacturing steps, as well as between cassettes or other retention devices.

In one embodiment of the invention, various chambers for fabricating wafers may be arranged into a sub-plant (aka processing station) accessible to the device 100. The chambers within the sub-plant may provide for etching, baking, processing by one or more photolithographic steppers and/or other wafer manufacturing steps. The arrangement of the chambers within the sub-plant may include configuring the chambers into a cylindrical or polygonal (e.g. hexagonal) arrangement about the device 100 and/or the framework. The device 100 may be used to rotate within the sub-plant while combining with the framework to gain vertical and/or horizontal freedom. As such, the device 100 may scale, climb, rotate, traverse or otherwise move about the sub-plant to transport wafers. Preferably, the framework and the device 100 of this invention are under automated control. As such, the device 100 can be adapted to operate with a programmable logic unit to control handling of the wafers and/or movements of the device 100 by a framework around a fabrication plant.

The device 100 includes a plurality of grippers, including a first gripper 110 and a second gripper 120, which are moveably coupled to a platform 150. A driver (aka carriage 130) may couple to the platform 150 and selectively couple to the grippers 110, 120 to selectively move at least one of the grippers 110, 120 in an axial direction along the platform 150. Magnetic couplers, such as an electromagnetic clutch, may be used to engage and move the grippers between positions. Magnetic propulsion may also be used to direct and/or control the carriage 130 along the platform. With these and other features, the invention provides several structural and functional improvements. These improvements include using only one driver to move two or more grippers, reducing the frictional and electrical components such as mechanical couplers that are more likely to fail, and moving the grippers using substantially frictionless contact. Other features, combinations, and advantages of various embodiments of the invention will be made clearer below.

With reference to the orientation shown in FIG. 1, the platform 150 includes a front end 156 and a back end 154 which define a principle or longitudinal axis of the platform. The platform 150 may also be referenced with respect to a first side 157 and a second side 158 aligned longitudinally with respect to the front or back end. The platform 150 may be pivotally mounted or rotatably assembled about a framework so that the platform has rotational motion. A track assembly may be provided as a unitary, integral or assembled component on the platform 150, and may include a center track 166 aligned along the principle axis of the platform 150. The center track 166 can include a linear propulsion magnetic motor. The track assembly may also include a first rail 162 and a second rail 164 which are aligned in the principle direction on both sides of the center track 166. Preferably, a carriage 130 slideably couples to the first rail 162 and extends laterally over the center track 166 to slideably couple to the second rail 164. A gap 169 may separate the carriage 130 from the center track 166. The carriage 130 includes a front side 132, and a back side 134. In this embodiment, the back side 134 is for coupling with the grippers.

A driver as defined herein may include any component or assembly that couples and moves grippers between positions on the platform 150. An embodiment may include a driver coupled to the platform 150 that is adapted to selectively couple with and move one of the grippers. With reference to FIG. 1, a preferred driver can include a linear coil motor, formed from the center track 166 and the carriage 130. In more detail, the center track 166 may be adapted to effectuate a magnetic field upon application of a current. To this end, the center track 166 may be formed from a series of permanent magnets or a series of coil cores. In the latter event, an electrical power source (not shown) may be coupled to the center track 166 to create a suitable magnetic field. The current may be passed through the coils, and a magnetic propulsion field may be created by continually switching the magnetic poles. Once the center track 166 is magnetized in this manner, the carriage 130 may be directed in either direction to move grippers between the front end 156 and back end 154. The carriage 130 may be metallic or otherwise adapted with magnetically susceptible materials to propel over the track assembly when the magnetic field is actuated. Additional components that may be used with, or as part of, the driver include a logic unit (see FIG. 2) such as controllers, or computer systems for controlling actuation of the power supply that creates the magnetic field along the center track 166. In one embodiment, the linear coil motor is an assembly manufactured by Trilogy Systems Corp.

under the model name LM210. The controller or logic unit coupled to the linear coil motor may be a readily commercially available unit manufactured by Della-Tau under the model number PMAC II. An amplifier may be coupled to the controller to amplify control signals sent to the linear coil motor. The amplifier can be a readily commercially available unit manufactured by Glentech Inc.

Alternatively, this invention may include a driver that uses non-magnetic forces to move the grippers. For example, the driver can include an electromechanical motor (not shown) coupled to direct the carriage 130 between the front end 156 and back end 154 of the platform 150 to move grippers that are slideably coupled to the platform. Examples of motors and other suitable devices for forcing the carriage 130 to couple with and move the grippers include synchronized motors, A/C motors, worm gears, and pneumatic devices.

Still referring to FIG. 1, the first gripper and second gripper 110 and 120 are moveably coupled to the platform 150. Preferably, the first gripper 110 is slideably mounted to the track assembly, and more specifically to the second rail 164. Likewise, the second gripper 120 is preferably slideably mounted to the first rail 162. The first gripper 110 includes a first head 108 adapted to engage the semiconductor wafer, with the first head 108 being aligned directly over the center track 166. The second gripper 120 includes a second head 118 aligned directly over the center track 166 and below the first head 108. Alternatively, the first head 108 and the second head 118 may be offset vertically and/or laterally. The first and second gripper 110 and 120 are each positioned between the back end 154 of the platform and the back side 134 of the carriage 130. Each head 108, 118 adapts the respective gripper 110, 120 to handle wafers by extending wafer handling elements, such as fingers or tongs (shown as elements 655 and 665 in FIG. 6). In this way, the extending and retracting wafer handling elements of each head 108, 118 may grip or ungrip each wafer.

The first gripper 110 exemplifies a preferred gripper for this invention and will be described in greater detail below. The first gripper 110 includes an arm 112 to support the first head 108. The arm 112 may include three segments, including a bottom horizontal member 114, a vertical segment 115, and a top segment 116. For the first gripper 110, the bottom horizontal member 114 extends from the second rail 164 to the vertical segment 115. The bottom horizontal member 114 may include a hollowed end to concentrically mount over the second rail 164 and allow slideable movement of the member 114 along the second rail 164. The vertical segment 115 extends from the bottom horizontal member 114 to the top segment 116, which in turn extends to the first head of the first gripper 110. The height of the first gripper 110 may be determined by the vertical segment 115. Likewise, the alignment of the head 108 may be determined by a length of the top segment 116 and/or the member 114. In this manner, the arms of each gripper may be dimensioned so that the first and second heads 108 and 118 may be vertically or laterally offset to align with individual slots in modules containing wafers without requiring adjustment of the position of the platform 150. Therefore, the heads of each of the grippers 110, 120 are vertically offset and aligned, while the heads 108, 118 may be staggered across the platform or aligned in a single plane. Additional grippers employed with a variation of the device 100 may similarly be positioned over the platform 150.

In a preferred embodiment, the carriage 130 moves the first gripper 110 and/or the second gripper 120 when the driver is actuated. To move the grippers, the carriage 130 selectively couples with either the first or second gripper, and the linear force applied from the driver forces the carriage 130 to push or pull the respective gripper. In one preferred embodiment, the carriage 130 uses magnetic coupling to selectively couple either the first gripper 110 or the second gripper 120. A preferred configuration of coupling magnets used to selectively couple grippers is shown by FIG. 1, where the platform contains a first platform magnet 180 near the second side 158 and a second platform magnet 182 near the first side 157. In addition, the first gripper 110 includes a first gripper magnet 188 preferably positioned on the member 114. Likewise, the second gripper 120 includes a second gripper magnet 190 similarly positioned. The carriage 130 includes a ferrous metal plate 184 near the second side 158 and a second ferrous metal plate 186 near the first side 157. While the magnets used for coupling in this particular embodiment are comprised of electromagnetic magnets, other embodiments may use permanent magnets in conjunction with mechanical motion of the plates and/or magnets to effect selective magnetic coupling.

In alternative embodiments, the invention may substitute non-magnetic couplers to effectuate a coupling between the grippers and the platform, and/or the carriage and the grippers. In particular, electromechanical grippers may be used as a substitute coupling. In this variation, for example, an electrically actuated clasp may be positioned on the carriage to engage a corresponding aperture on the grippers. A current or charge source may be supplied to the carriage, along with a sensor to indicate impact with the gripper. Upon impact, the clasp may enter the aperture in an unlocked position. The sensor may electrically actuate the clasp from the unlocked to the locked position. Unlocking may be accomplished after a time delay in which the gripper has retained the wafer. Once unlocked, the carriage may push the gripper back to the home position without coupling. Alternatively, the gripper may be equipped with sensors to detect the home positions in which the clasp is signaled to the unlocked position with or without affecting a second electrically actuated clasp for the other gripper. Still further, the clasp may communicate with a computer system or controller to actuate between a locked and unlocked position.

In another variation (not illustrated), mechanically releasable fasteners may be used to selectively couple the carriage and one of the grippers, or one of the grippers and the platform. For example, one embodiment of the invention may provide a mechanical switch coupled to a mechanical controller for displacing a clasp or fastener on the carriage between a first and second position, where the first position aligns with one of the grippers and the second position aligns with another of the grippers. The clasp or fastener may friction fit or biasely engage a corresponding aperture on the gripper. The carriage may then engage one of the grippers to secure the mechanical fastener and allow the carriage to pull the gripper to the front end. A portion of the track or platform near the back may be dimensioned to receive the carriage but not the gripper, forcing the mechanical fastener to release the carriage from the gripper. Thus, in the home position, the fastener may engage and secures to the other gripper, while another coupler may be used to retain the previously released gripper in the home position.

In another variation, one or more mechanical fasteners may include vacuum ports. For example, either one of the gripper magnets 188, 190 may be replaced by a drum being fed a vacuum tube. Selective actuation of the vacuum tube may then be used to draw the gripper to the carriage 130, or to the base of the platform. Similarly, the platform magnets 180, 182 may also be substituted by drums having vacuum resources for drawing either the carriage 130 or the grippers 110, 120 to the platform.

Figure 2:
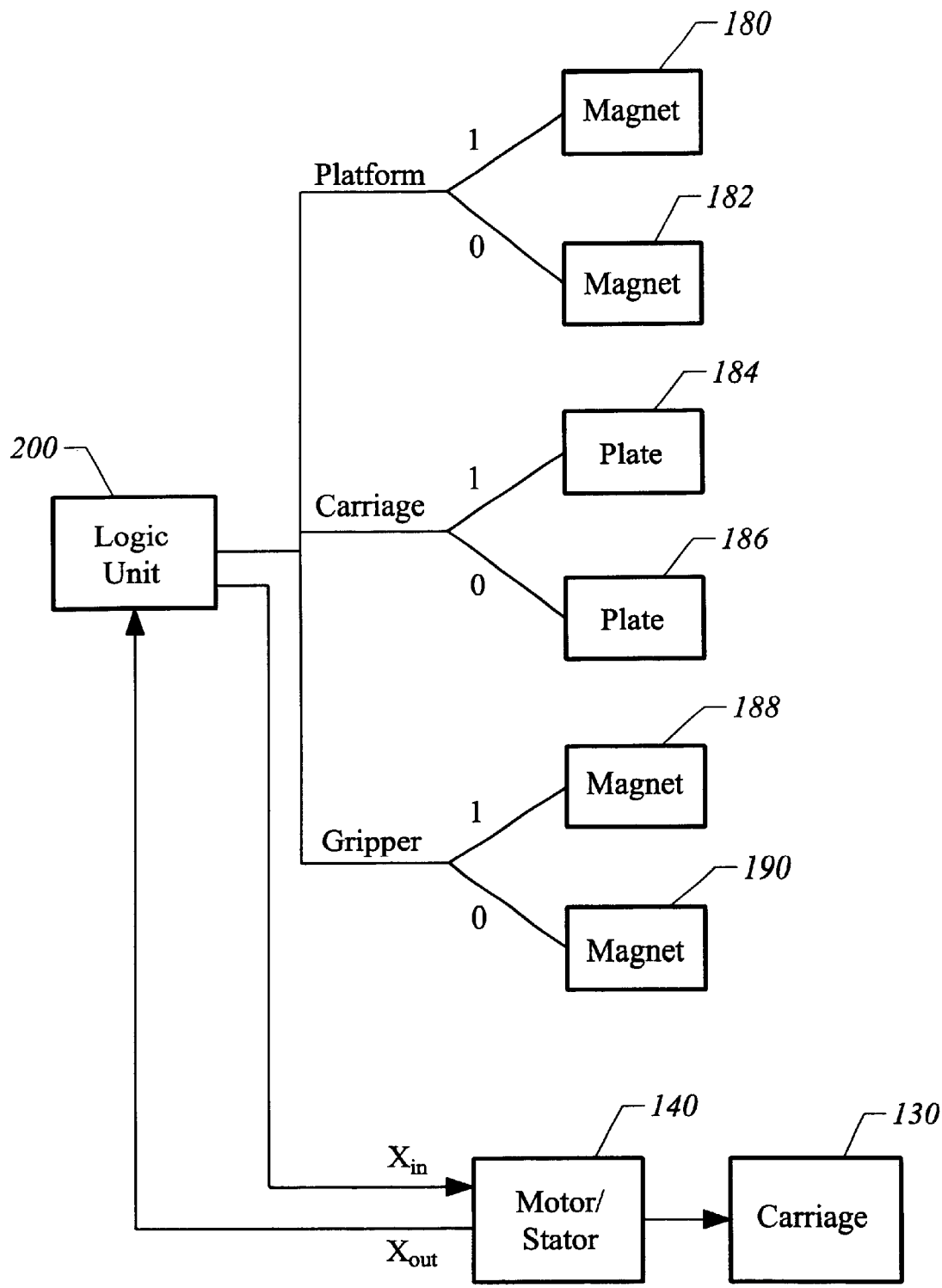
FIG. 2 is a block diagram showing a logic unit representing an embodiment of the invention.

FIG. 2 shows a subsystem where a logic unit 200 or computer system having processor and memory resource controls the position of the carriage 130, as well as the first gripper 110 and the second gripper 120. The logic unit 200 may be a programmable computer system or controller, such as a readily commercially available Delta-Tau LM410 controller, or other computer system programmed to control the driver. The logic unit 200 may provide an output signal $x_{in}$ to the driver to position the carriage 130 axially on the track assembly. The output signal may control the position of the carriage 130 between a first and second axial position. In his way, the logic unit 200 may signal to move the carriage 130 to the first axial position corresponding to the position of the first or second gripper, so that the carriage may couple with the gripper. The logic unit 200 may then signal to move the carriage 130 to the second axial position, so that the carriage pushes or pulls or otherwise forces the coupled gripper to the second axial position. Similarly, the logic unit 200 may signal the carriage 130 to push/pull the gripper back to the first axial position. The first and second positions may correspond to either a home position for the gripper near the back end 154 or an engaged position for the gripper near the front end 156. The controller may also signal to have the carriage direct either one of the grippers to an intermediate position.

FIG. 2 also shows a feedback signal $x_{out}$ may be used to communicate to the logic unit 200 information such as the position of the carriage 130. The logic unit 200 may use the position feedback signal $x_{out}$ to derive velocity and acceleration profiles as well. One advantage of a preferred embodiment that combines the logic unit output, signal feedback, and magnetic couplings as described herein is that the impact between the driver and the grippers may be minimized. More specifically, the velocity or acceleration of the carriage 130 may be reduced prior to impacting one of the grippers. In a preferred embodiment, the velocity of the carriage 130 is reduced sufficiently to allow the gripper being coupled to begin accelerating towards the carriage 130 prior to impact. As such, the impact between the grippers and the carriage 130 may be more evenly distributed, thereby increasing the operation lifespan of the device 100.

With further reference to FIG. 2, the logic unit 200 also controls selective actuation of the electromagnetic magnets employed with a preferred embodiment of the device 100. The combination of the logic unit 200 and the configuration of magnets may effectuate selective coupling of the first grippers 110 and/or the second grippers 120 to move along with the carriage 130. As shown by FIG. 2, the logic unit 200 may use, for example, digital switching to select actuation between either the first platform magnet 180 or the second platform magnet 182, the first gripper magnet 188 or the second gripper magnet 190, and the first plate 184 or the second plate 186. The selective actuation of the magnets used for coupling the carriage 130 with either of the grippers may be described in states. In a first actuation state, the first gripper magnet 188 and the first plate 184 are actuated so that the carriage couples to the first gripper 110, while the first platform magnet 180 is off, and the second platform magnet 182 is on to 110 hold the second gripper 120 back. In a second actuation state, the second gripper magnet 190 and the second plate 186 are actuated so that the carriage 130 couples to the second gripper 120, while the first platform magnet 180 is on and the second platform magnet 182 is off. In this second state, the first gripper 110 would be held back. Preferably, the first and second platform magnets 180 and 182 have sufficient magnetic force when actuated to couple and contain the respective gripper securely in a home position when the other gripper is actuated. Similarly, the first and second plates 184 and 186 preferably have sufficient magnetic susceptibility to allow the carriage to pull or otherwise direct the respective gripper between positions. The combination of one of the platform magnets coupling the corresponding gripper, and/or one of the carriage magnets coupling to the corresponding gripper, may form with the logic unit 200 a magnetic clutch.

Figure 3A:
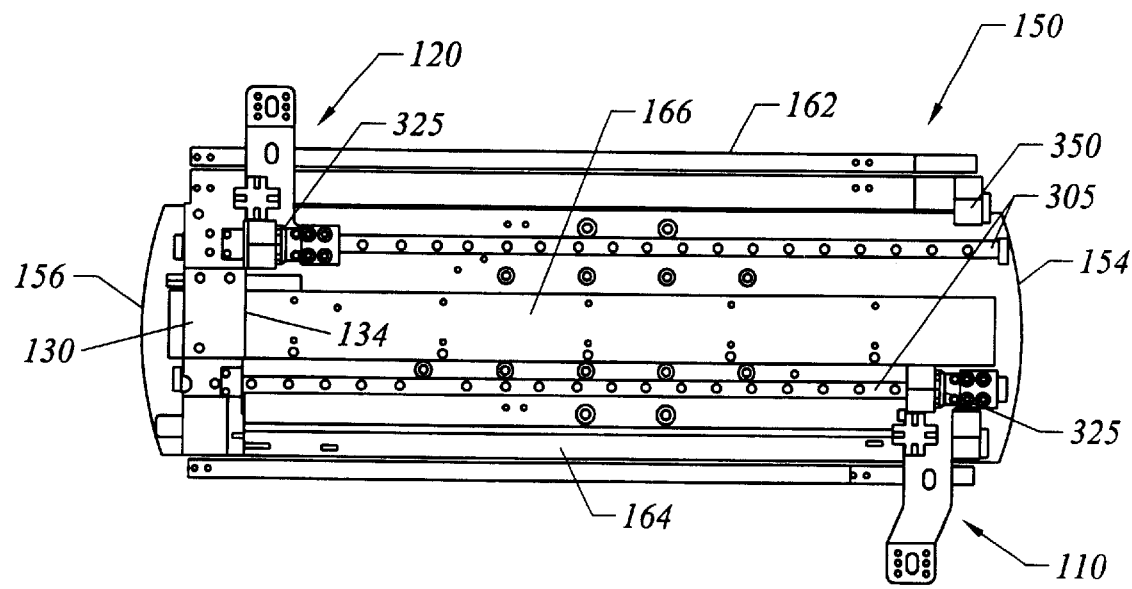
FIG. 3A is a top view of a robot showing a first state where one gripper is extended to engage a semiconductor wafer, while another gripper is retracted, representing an embodiment of the invention.
Figure 3B:
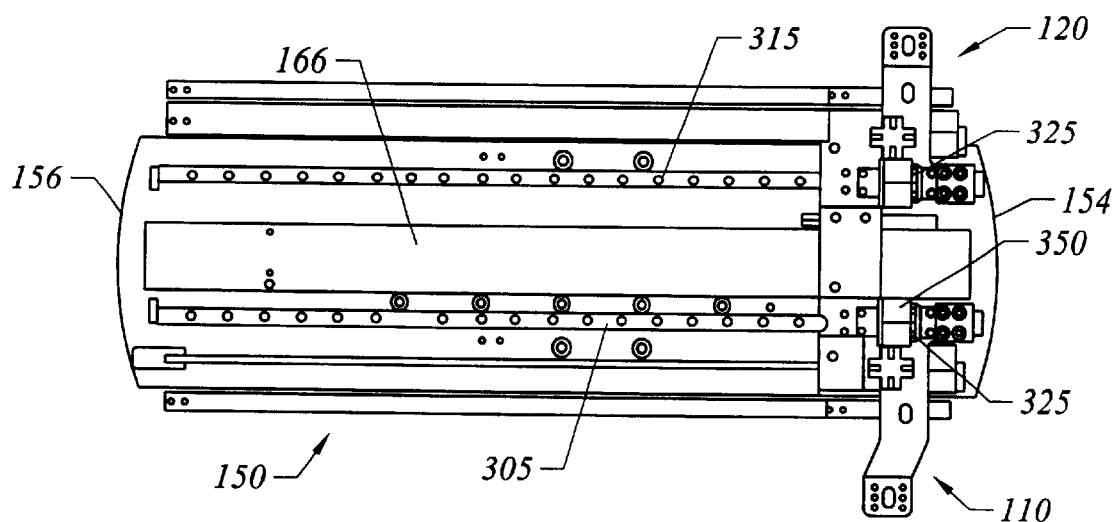
FIG. 3B is a top view of the preferred embodiment of FIG. 3A showing a second state where both of the grippers are retracted, representing an embodiment of the invention.

FIG. 3A depicts a top view of the platform 150 showing one of the actuation states where the second gripper 120 is positioned at the front end 156 of the platform 150. The back side 134 of the carriage 130 is coupled to the base of the gripper 120, so that the carriage 130 pulls the second gripper 120 to the front end 156. In a subsequent motion, the carriage 130 would push the second gripper 120 to the back end 154 of the platform 150. FIG. 3B shows the first and second grippers 110 and 120 being in the home position at the back end 154 of the platform 150. The home position may correlate to the device 100 being inactive or positioned for calibration.

FIGS. 3A and 3B also show that the platform may include one or more sensors for providing information regarding the position, velocity, or acceleration of either the carriage 130 and/or the grippers. In a preferred embodiment, a linear encoder 305 is extended longitudinally along the center track 166 having a magnetic propulsion field. The linear encoder may convey, for example, position feedback coordinates to the logic unit 200 (as depicted by $x_{out}$ in FIG. 2) coupled to the driver. The position coordinates may be retained on the linear encoder 305 in various forms, such as digital optical coding or analog/digital magnetic coding. A sensor or reader (not shown) coupled to the driver, and preferably to the carriage 130, or alternatively to the grippers, may read the position coordinates from the linear encoder 305. Once position coordinates are provided, the logic unit 200 may then control the current output to the motor, and preferably to the linear coil motor, so that the position of the grippers on the platform 150 may be more precisely controlled.

Other feedback mechanisms associated with the platform 150 include one or more sensors 325 positioned at a base 350 of the platform 150 where the grippers couple to the platform. Each sensor 325 may be used to determine whether the driver or carriage 130 has securely coupled to the first or second gripper. For example, the sensors 325 may include photodetectors that detect whether the carriage 130 has departed from the base 325 without the corresponding gripper. The sensors 325 may also be used for functions such as determining whether the first gripper 110 or second gripper 120 is in the home position.

Figure 4:
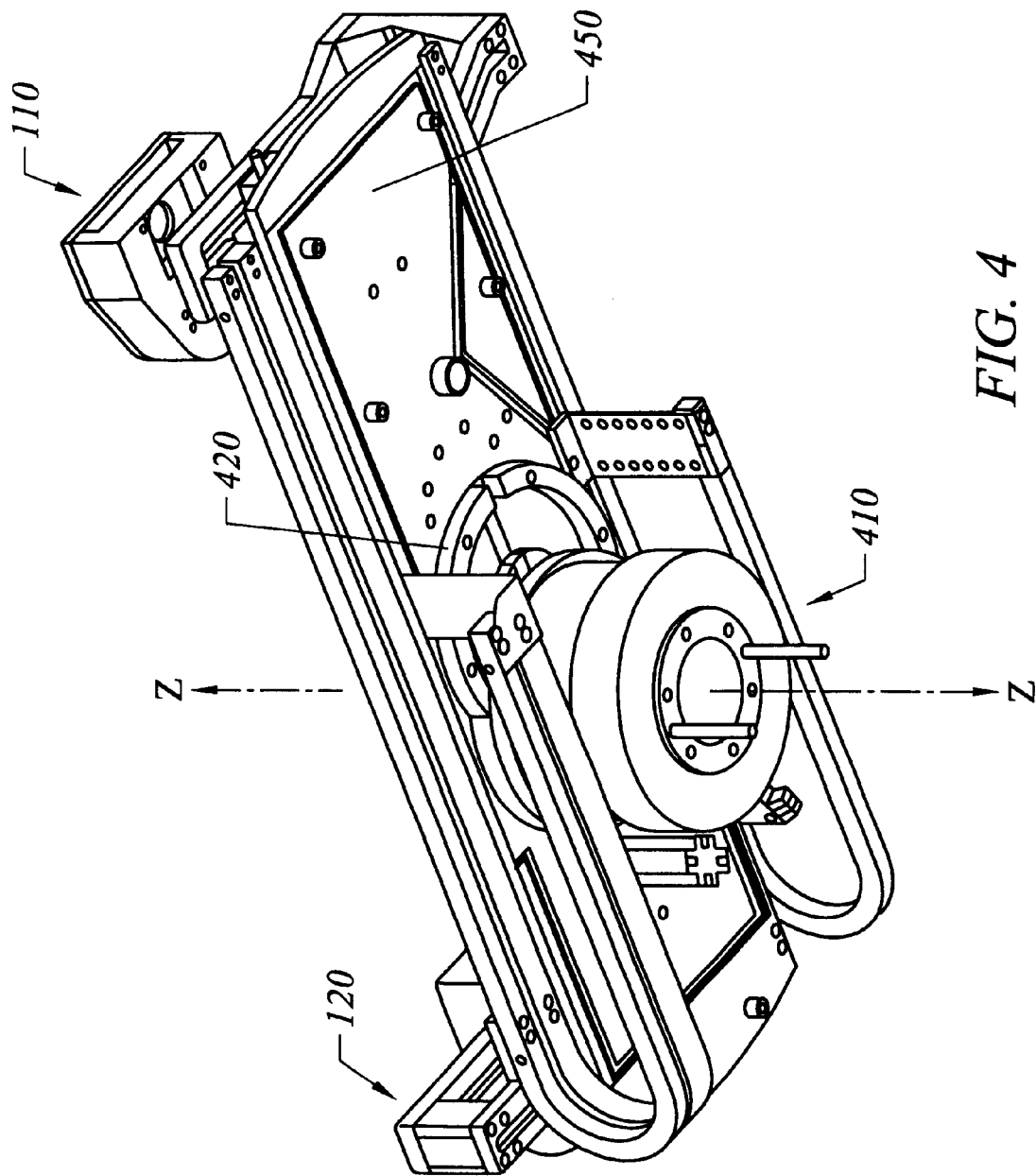
FIG. 4 is a bottom isometric view of a platform, representing an embodiment of the invention.

FIG. 4 depicts a bottom surface 450 of the platform 150 showing the second gripper 120 extended to an actuated state for handling wafers. A servomechanism 410 is mounted to the bottom surface 450 via a mounting platform 420. The servomechanism 410 allows the platform 150 to rotate about the z-axis of FIG. 4. Additional servomechanisms, or an alternative alignment for the servomechanism 410, may be used to add other rotational axes or otherwise shift the direction of the z-axis.

FIG. 5 illustrates the device 100 employed with one specific application where a dynamic framework 500 is capable of transporting the device 100 in one or more linear directions. A base 510 couples the servomechanism 410 to the framework 500 via a horizontal member 520 that is slideably coupled to one or more vertical members 530. The base 510 is slideably coupled to the horizontal member 520. In combination, the framework 500 and the servomechanism 410 combine to provide the device 100 with vertical, horizontal, and rotational abilities. In this way, the device 100 may be efficiently used with various semiconductor manufacturing equipment, such as cassette end stations or stepper interface stations in wafer processing sub-plants.

Figure 6:
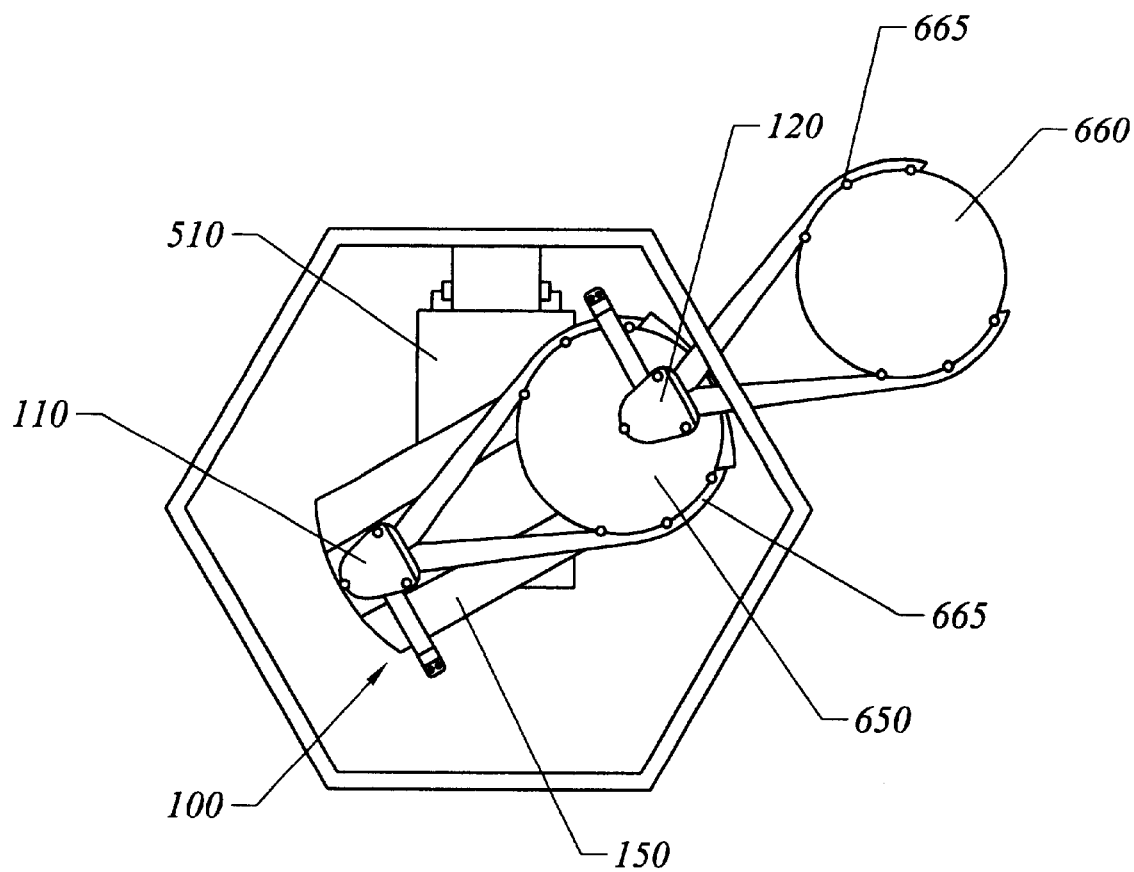
FIG. 6 is a top view of a robot in a processing station holding two wafers.

FIG. 6 is an illustrative top view showing the device 100 of a preferred embodiment in another wafer processing application. As shown by FIG. 6, the device 100 may be coupled to a main robot or wafer transporting device positioned in a sub-plant or similar device for rotating between stacks of wafer processing modules. The first gripper 110 is shown retracted to the back end of the platform 150 after having retained a first wafer 650 with a first pair of fingers or tongs 655. The second gripper 120 is shown positioned at the front end to displace a second wafer 660 with a second pair of fingers or tongs 665. As shown by FIG. 6, the first and second grippers 110 and 120 are selected one at a time by the driver to handle and displace wafers. Whether or not the first and/or second gripper 110 and 120 each retain wafers, the platform 150 may rotate to transport one or both of the wafers between stacks of wafer processing modules. The platform 150 may also move vertically as shown in FIG. 6 to scale between cassettes in individual stacks.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A semiconductor wafer handling device comprising:
   a track assembly mounted on a device platform to support the handling of semiconductor wafers, wherein the track assembly includes a center track positioned along a longitudinal axis of the platform and at least one gripper rail longitudinally aligned with the center track;
   at least one semiconductor wafer gripper formed with a gripper electromagnet that is slideably mounted to the gripper rail;
   a carriage slideably mounted on the gripper rail that is adapted to selectively push-and-pull the semiconductor wafer gripper along the longitudinal axis of the platform, wherein the carriage is formed with at least one carriage plate for selective magnetic coupling to the gripper electromagnet; and
   a logic unit in communication with the carriage for controlling movement of the carriage to different positions along the platform, wherein the logic unit includes signal lines connected to each gripper electromagnet and carriage plate for their selective actuation, and wherein the carriage plate may be magnetically coupled to the gripper electromagnet of a selected semiconductor wafer gripper so as to push-and-pull the semiconductor wafer gripper together as the carriage moves along the platform.

2. The semiconductor wafer handling device as recited in claim 1, wherein the logic unit transmits a first output signal to the carriage to instruct the carriage to move to a first position along the platform.

3. The semiconductor wafer handling device as recited in claim 2, wherein the logic unit transmits an actuation signal to the gripper electromagnet of the selected semiconductor wafer gripper and its corresponding carriage plate so that the carriage and the selected semiconductor wafer gripper move together magnetically coupled as the carriage moves to the first position along the platform.

4. The semiconductor wafer handling device as recited in claim 1, wherein the logic unit transmits a second output signal to the carriage to instruct the carriage to move to a second position along the platform.

5. The semiconductor wafer handling device as recited in claim 1, wherein the platform is formed with a front end and a back end, and wherein the carriage may move along the gripper rail between the front end and the back end of the platform.

6. The semiconductor wafer handling device as recited in claim 1, wherein the carriage is formed with a back side, and wherein the carriage plate are mounted along the back side of the carriage.

7. The semiconductor wafer handling device as recited in claim 1, wherein the semiconductor wafer gripper includes a head portion for housing a semiconductor wafer, and wherein the head portion is positioned in vertical position substantially above the center track.

8. The semiconductor wafer handling device as recited in claim 1, wherein the semiconductor wafer gripper includes at least one retractable wafer handling element for handling semiconductor wafers.

9. A electromagnetically-actuated semiconductor wafer handling device comprising:
   a track assembly mounted on a device platform to support the handling of semiconductor wafers having a first platform electromagnet and a second platform electromagnet, wherein the track assembly includes a center track positioned along a longitudinal axis of the platform, and a first rail and a second rail longitudinally aligned with the center track;
   a first wafer gripper slideably mounted to the first rail for handling wafers that Is formed with a first gripper electromagnet;
   a second wafer gripper slideably mounted to the second rail for handling wafers that is formed with a second gripper electromagnet;
   a carriage slideably mounted on the first rail and the second rail that is adapted to selectively push-and-pull the first and the second wafer grippers along the longitudinal axis of the platform, wherein the carriage is formed with carriage plates for selective magnetic coupling with the first and the second gripper electromagnets; and a logic unit in communication with the carriage and the carriage plates for controlling movement of the carriage along the platform to selectively push-and-pull the first and the second wafer grippers to preselected positions along each respective rail by selective magnetic actuation of the carriage plates which couple to the first and the second gripper electromagnets, and wherein the logic unit is also in communication with the first and the second platform electromagnets for selective magnetic actuation of the first and the second platform electromagnets to retain the first and the second wafer grippers in an initial position.

10. The electromagnetically-actuated semiconductor wafer handling device as recited in claim 9, wherein the logic unit is includes signal lines connected to the carriage, to the first and the second platform electromagnets, the first and the second gripper electromagnets, and the carriage plates.

11. The electromagnetically-actuated semiconductor wafer handling device as recited in claim 9, wherein the first wafer gripper and the second wafer gripper each include a gripper head for housing a semiconductor wafer.

12. The electromagnetically-actuated semiconductor wafer handling device as recited in claim 11, wherein the gripper heads of the first and the second wafer gripper includes a vertical member formed of different heights to suspended each gripper head at a predetermined height substantially above the center track.

13. The electromagnetically-actuated semiconductor wafer handling device as recited in claim 12, wherein the first wafer gripper is vertically offset from the second wafer gripper to permit both to pass by each other along the platform.

14. A semiconductor wafer handling apparatus comprising:

a track assembly mounted on a device platform to support the handling of semiconductor wafers having a plurality of platform electromagnets, wherein the track assembly includes a center track positioned along a longitudinal axis of the device platform, and a plurality of gripper rails each longitudinally aligned with the center track, a plurality of semiconductor wafer grippers each slideably mounted onto a separate gripper rail for handling wafers, wherein each semiconductor wafer gripper is formed with a gripper electromagnet;

a carriage slideably mounted onto at least one gripper rail that is adapted to selectively push-and-pull the semiconductor wafer grippers along the longitudinal axis of the device platform, wherein the carriage is formed with a plurality of metal carriage plates for selective magnetic coupling with a corresponding gripper electromagnet; and a control unit in communication with the carriage for controlling carriage movement along different positions of the device platform, wherein the control unit includes signal lines to each platform electromagnet for selectively actuating each platform electromagnet for magnetic coupling to a corresponding semiconductor wafer gripper, and to each gripper electromagnet to selectively actuate each gripper electromagnet for magnetic coupling to a corresponding metal carriage plate so as to push-and-pull at least one semiconductor wafer gripper while the carriage moves along the device platform as instructed by the control unit.

* * * * *